ent [19] [11] 4,033,773
Lewis et al. [45] July 5, 1977

[54] RADIATION PRODUCED COLORED PHOTOPOLYMER SYSTEMS

[75] Inventors: James Marvin Lewis, Aurora; Raymond Willis Newyear, Willoughby, both of Ohio

[73] Assignee: Horizons Incorporated, a division of Horizons Research Incorporated, Cleveland, Ohio

[22] Filed: Feb. 9, 1976

[21] Appl. No.: 656,260

Related U.S. Application Data

[62] Division of Ser. No. 500,931, Aug. 27, 1974, Pat. No. 3,954,468.

[52] U.S. Cl. .................. 96/115 P; 204/159.15; 204/159.23
[51] Int. Cl.² ............................................ G03C 1/68
[58] Field of Search ............... 96/115 P, 35, 35.1, 96/48 R, 38.1, 33; 204/159.15, 159.23

[56] References Cited

UNITED STATES PATENTS

| | | | |
|---|---|---|---|
| 3,351,467 | 11/1971 | Sprague et al. | 96/90 R |
| 3,418,118 | 12/1968 | Thommes et al. | 96/35.1 |
| 3,512,975 | 5/1970 | Monder et al. | 96/48 R |
| 3,527,639 | 9/1970 | Moraw | 96/90 R |
| 3,554,752 | 1/1971 | Hachmann et al. | 96/48 R |
| 3,600,179 | 8/1971 | Yamada et al. | 96/90 R |
| 3,620,748 | 11/1971 | Fichter | 96/90 R |
| 3,769,023 | 10/1973 | Lewis et al. | 96/115 P |
| 3,820,993 | 6/1974 | Lewis et al. | 96/115 P |
| 3,833,373 | 9/1974 | Hazenbossh et al. | 96/35 |

*Primary Examiner*—Jack P. Brammer
*Attorney, Agent, or Firm*—Lawrence I. Field

[57] ABSTRACT

A colored image in a polymer binder is obtained by polymerization of a mixture comprising (1) at least one polymerizable monomer, (2) a halogen containing activator (free radical source), (3) a binder, and (4) at least one normally bleachable dye, dissolved in such mixture; the polymerization being accomplished by imagewise exposure of said composition to a suitable dose of radiation, and is accompanied by fixing of the dye to the photopolymer. As a consequence, the dyes lose their bleaching characteristic and when the exposed areas are developed with a strong acid such as one which would normally bleach the dye, the dye is bleached from only the unexposed areas. If the developer also includes an aliphatic alcohol, the unexposed areas may be removed, leaving a relief image with color in the raised portions.

7 Claims, No Drawings

RADIATION PRODUCED COLORED PHOTOPOLYMER SYSTEMS

This is a division of application Ser. No. 500,931, filed Aug. 27, 1974, now U.S. Pat. No. 3,954,468.

This invention relates to an improvement on the invention described in U.S. patent application Ser. No. 447,267 entitled "Broad Spectrum Response Photoresist for Holography & Laser Recordings" filed Mar. 1, 1974 by the present applicants. More particularly it relates to a procedure whereby a chosen colored imagewise result is obtained by imagewise exposure and wet development of compositions which are similar to those described in that application, the disclosure of which is incorporated herein by reference.

In general terms, the compositions to which the present invention is applicable consist essentially of the following constituents:

a. one or more photopolymerizable monomer selected from the group consisting of N-vinylamines, N-vinylamides, N-vinylimides, acrylamides and congeners of said monogram;

b. one or more organic halogen compound which produces free radicals on exposure to suitable radiation and which activates the photopolymerization of (a);

c. at least one dye which normally bleaches out on exposure to light but which becomes fixed to the photopolymer and loses its bleaching characteristic as a result of said photopolymerization; and d. a suitable binder in which the several constituents (a), (b) and (c) are each dissolved.

Other optionally present constituents include any one or more of the following:

crosslinking agents,
stabilizers to light and/or heat,
optical sensitizers.

The desired colored imagewise result is produced by wet development of the composition after imagewise exposure and photopolymerization of the monomer in the composition, development being accomplished by means of a strong acid or a mixture of such acids.

The colored image type result is made evident by wet development with strong acids in a manner which does not remove the unexposed binder areas but which does leach out the dye in the exposed areas. Wet development with strong acids may be accomplished with a mixture of such acids plus aliphatic alcohols. Such mixtures simultaneously leach out the dye and also remove the unexposed areas partially or completely. The dyes used sensitize the polymerization reaction to the wavelengths at which the dyes absorb light.

The above described system is designed primarily for response to electromagnetic radiation of actinic nature. Its response to x-rays and particulate radiation such as electron beams is enhanced by the addition of matalloorganic compounds in which the metal portion of said organic compound exhibits an atomic number of 50 or more.

Related inventions are described in U.S. Pat. Nos. 3,769,023 and 3,820,993 entitled "Light Sensitive Reproduction and Electron Beam Sensitive Material" Issued Oct. 30, 1973 and June 28, 1974, respectively, and in an application entitled "Broad Spectrum Response Photoresists for Holography and Laser Recording", filed Mar. 1, 1974 (Ser. No 447,267) now U.S. Pat. No. 3,899,338 and in Ser. No. 488,857 filed July 15, 1974, now U.S. Pat. No. 3,925,077.

In the practice of the present invention, the photopolymerizable monomers, the halogen containing activators, stabilizers, and other constituents are first dissolved in a suitable solvent or mixture of solvents. A polymeric binder material, preferably of the type which is soluble in an alcohol selected from the group consisting of methyl, ethyl, propyl and butyl alcohols and mixtures thereof and is also soluble in mixtures of these alcohols plus aqueous solutions of specific acids is then added to the solution and the solution is stirred until a clear liquid is obtained. After filtering, a dye which normally bleaches out readily on exposure to light is added to the solution directly or as a solution of the dye in quantities sufficient so that the film eventually produced from this mixture exhibits a distinct color as a consequence of a concentration of the dye used. This solution is then spread as a coating, by known techniques onto an appropriate surface and dried at temperature not exceeding 50° C, preferably at room temperature.

Making up the composition and applying it as a coating is carried out under safelight conditions consistent with the spectral absorption of the dye used. Red light may be used for dyes which absorb up through the green and for dyes or mixtures thereof which absorb red light the operation must be carried out in complete darkness.

After imagewise exposure to light of appropriate wavelength or other suitable radiation the sample is then heated in a temperature range between 90° C and 160° C for periods varying between 30 seconds and 1 minute, this operation also being carried out under safelight conditions. The sample is then wet developed by known techniques such as dipping or spraying with acid-containing solutions which may contain alcohols. If developed with acid solutions alone, the dye is leached out from the unexposed areas but is not leached out from the exposed areas and an essentially planographic surface is obtained in which the previously exposed areas exhibit a very slight relief. If alochols are added to the acid developer solution not only is the dye leached out but some or all of the unexposed polymeric bonding material is also removed depending on the time of development and the alochol concentration.

The product obtained in accordance with the practice of this invention is useful in the graphic arts for the purposes of making color separations. The product is also suitable for the preparation of colored photoresists for the manufacture of lithographic plates. It is particularly useful as a color coding or photoresists for the manufacture of printed circuits particularly of the multilayer type in which said color coding may be used not only for production routing purposes but also as an aid in registration of multilayer circuits. Phase, refractive index, and topgraphical type holograms may be produced. While these photoresist compositions are particularly suitable for the formation of relief phase holograms, generally called thin film surface reflection type holograms, thick phase holograms, optical components such as diffraction gratings, holographic tape for video cassette recording, microfiche type holograms and similar devices where the presence of color in the developed and fixed resist is important, these compositions are also suitable for the preparation of patterns whereby after suitable development, photomechanical milling may be accomplished for printing plates, printed circuits, microelectronic circuits and general chemical milling of metals, plastics and glass where the original pattern is formed in the photoresist placed on a suitable surface by the medium of scanning with a modulated or unmodulated laser beam of chosen wavelength and a relatively low power.

The invention will be further understood from the tables and Examples which follow in which preferred embodiments of the invention are set forth by way of illustration and which are not intended to limit the invention in any way.

Table 1 sets forth classes of dyes which are suitable for the practice of the present invention, these being identified as follows:

in which $R_1$ through $R_8$ represent at least one hydroxyl, amino, monoalkylamino, alkylarylamino, dialkylamino, thiyl, benzamido methoxy, methoxy benzamido, naphthamido, anthrimide, carbazole, quinoylurea, quinoline, thiazole acetamido, alkyl, and halogen; and when the only substituent is alkyl it is $R_2$ or $R_7$ and the balance of the R's are H; and when the only substituent is halogen it is $R_2$ or $R_7$ and the balance of the R's are H; when the substituent is amino, substituted amino or hydroxyl the $R_1$ and $R_4$ positions are preferred though other R's may be filled, and if not the other R's are H; and each of $R_1$ through $R_8$ with the exceptions noted above may be the same or different.

| DYE NO. | DYE | DYE CLASS A LONG WAVELENGTH Å RESPONSE | COLOR OF DYE IN PHOTORESIST |
|---|---|---|---|
| 1 | $R_1$ and $R_4$ = diethylamino<br>other R's = H | 6400 Å | Blue |
| 2 | $R_1$ = benzoamido<br>other R's = H | 4400 Å | Yellow |
| 3 | $R_1, R_4, R_5$ = amino<br>other R's = H | 6800 Å | Violet |
| 4 | $R_1, R_4, R_5, R_8$ = amino<br>other R's = H | 7300 Å | Blue |
| 5 | $R_1$ = amino, $R_4$ = hydroxy<br>other R's = H | 7000 Å | Pink |
| 6 | $R_1, R_4$ = $NHC_5H_{11}$<br>other R's = H | 6400 Å | Blue |
| 7 | $R_1$ = methylamino)<br>$R_4$ = aminoanilino)<br>other R's = H | 7970 Å | Green |
| 8 | $R_4, R_5$ = amino<br>$R_1, R_8$ = hydroxy<br>other R's = H | 7000 Å | Blue |
| 9 | $R_1$ and $R_4$ = hydroxy<br>other R's = H | 5000 Å | Orange |
| 10 | $R_1$, 3,4,5,7,8 = hydroxy<br>other R's = H | 7500 Å | Blue |
| 11 | $R_1$ = amino, $R_4$ = $NHC_2H_5$<br>other R's = H | 6400 Å | Blue |
| 12 | $R_1$ and $R_5$ = amino<br>other R's = H | 5000 Å | Red |

DYE CLASS A — Substituted Anthraquinones
DYE CLASS B — Binuclear Merocyanines (as defined in U.S. Pat. No. 3,102,027, col. 5+ and in U.S. Pat. No. 3,578,456, Claim 7.)
DYE CLASS C — Complex Merocyanines (as defined in U.S. Pat. No. 3,102,027)
DYE CLASS D — Cyanine Dyes (as defined in U.S. Pat. No. 3,104,973)
DYE CLASS E — 9-Phenyl-fluoren-9-ols, e.g. as defined in U.S. Pat. No. 3,000,833)

TABLE 1

Examples of Acid Leachable Dyes for the Present Invention

DYE CLASS A
Substituted Anthraquinones
Anthraquinones suitable as the acid leachable dyes in the compositions of the present invention are represented by the general formula

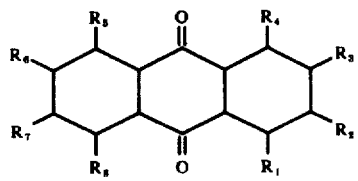

DYE CLASS B
Binuclear Merocyanines
Binulcear merocyanines suitable for this invention are represented by the general formula

wherein R represents a member selected from the group consisting of alkyl and aralkyl groups (including carboxyalkyl and sulfoalkyl groups), $n$ represents a positive integer from 1 to 2, $m$ represents a positive integer from 1 to 4;

Q represents the non-metallic atoms necessary to complete a heterocyclic nucleous containing from 5 to 6 atoms in the ring, and exemplary of this dye class are the rhodanines, oxanzolediones, 2-thiohydantoins, alkyl and/or aryl pyrazolones, 4-thiazolidones, and thiazolones, and 1,3 indanethiones; and Z represents the non-metallic atoms necessary to complete a heterocyclic nucleus containing 5 to 6 atoms in the heterocyclic ring, as for example, benzoxazoles, benzothiazoles, and other alkyl or aryl oxazoles and thiazoles, quinolines, pyridines, and 3,3-dialkyl indolenines.

| DYE NO. | DYE | DYE CLASS B RESPONSE LONG WAVELENGTH Å | COLOR OF DYE IN PHOTORESIST |
| --- | --- | --- | --- |
| 13 | 3-ethyl-5[3-ethyl-2(3H)-benzoxazolylidene)-ethylidene]-rhodanine | 4800 to 5200 | Orange |
| 14 | 3-ethyl-5-[(1-methyl-4-(1H)-quinolylidene ethylidine] rhodanine | 6100 to 7000 | Blue |
| 15 | 2-[(3-ethyl-2-(31-)-benzoxazolylylidene)- | 4880 | Orange |
| 16 | 2-butenylidene-1,3-indanedione | 5000 to 6400 | Magenta |
| 17 | 5-(1-ethyl(1H)-quinolylidene)-3-ethyl-2-thio-2,4-oxazolidene dione | 4400 | Yellow |

DYE CLASS C
Complex Merocyanines of which is intended to be incorporated by this reference.

| DYE NO. | DYE | DYE CLASS C RESPONSE LONG WAVELENGTH Å | COLOR OF DYE IN PHOTORESIST |
| --- | --- | --- | --- |
| 18 | 2-(p-dimethylaminostyril) 3,4-dimethylthiazolium-p-toluene sulfonate | 4500 to 5100 | Yellow |
| 19 | 2(4-p-dimethylaminophenyl-1-3-butadienyl)benzothiazole metho-p-toluene sulfonate | 5000 to 5700 | Red |
| 20 | 3-ethyl-5-[(3-ethyl-2(3) benzothiazolylidene)ethylidene] 2[cyano-2-quinolylmethylene] 4 thiazolidone | 5200 to 5600 | Red |
| 21 | 3-ethyl-5[2-(1 methyl-4-5-dihydro-β-naphthothiazolylidene)ethylidene]2(2-6-chloroquinolylmethylene)4-thiazolidone | 5000 | Red-Green |
| 22 | 3-ethyl-5[1-ethyl-4(1H) quinolylidene)-2-butenylidene]rhodanine | 7000 to 8000 | Blue-Green |
| 23 | 3-ethyl-5-[β-(ethyl-5,6-dimethyl-2(3)-benzothiazolylidene)-a-ethyl-ethlidene-2-3-ethyl-4-methyl-5-phenythiazole-ethiiodide)-methylidene]-4-thiazolidone | 6000 to 7000 | Purple |

Complex merocyanines suitable for this invention include: quaternized merocyanines; quaternary salts derived from merocyanine, unsymmetrical dyes from quaternary salts of merocyanines, stryrl and butadienyl dyes from quarternary salts of merocyanines, pyrrolocyanines from quaternary salts of merocyanines, and hemicyanines derived from quaternized merocyanines where if the acid radical X is present, X is taken from the class of alkyl sulfate ions, aryl sulfonate ions and iodine ions (iodides) as described in column 7 through 10 of U.S. Pat. No. 3,102,027, the disclosure

DYE CLASS D
Cyanines

Cyanine dyes useful in the present invention are described in columns 5-7 of U.S. Pat. No. 3,104,973 dyes including the sulfonates and iodides of (a) symmetrical and unsymmetrical cyanines; (b) symmetrical and unsymmetrical pyrrolocyanines; (c) hemicyanines; (d) carbocyanines; (e) styryl cyanines; and vinylene homologs of styryl cyanines., the disclosure of which is incorporated by reference. Both the dyes and the dye bases are useful.

| DYE NO. | DYE | DYE CLASS D RESPONSE LONG WAVELENGTH Å | COLOR OF DYE IN PHOTORESIST |
| --- | --- | --- | --- |
| 24 | 4-[(3-methyl-2(3H)-benzothiazolidene) methyl]quinoline hydro-p-toluene sulfonate | 5000 | Red |
| 25 | 3,3', 4'-trimethyl-oxathiazolo carbo-cyanine iodide | 5000 | Red |
| 26 | 1,1'-dimethyl-4,4' carbocyanine-p-toluene sulfonate | 6400 to 7000 | Blue |
| 27 | 4-[3-ethyl-2(3H)benzo- | | |

-continued

DYE CLASS D

| DYE NO. | DYE | RESPONSE LONG WAVELENGTH Å | COLOR OF DYE IN PHOTORESIST |
|---|---|---|---|
|  | thiazolylidene)propenyl] quinoline hydroiodide | 4500 to 6200 | Red-Orange |
| 28 | 1,1',3,3,3',3' hexamethyl indodicarbocyanine-p-toluene sulfonate | 6400 to 7000 | Blue to Cyan |
| 29 | 3,3' diethylthiadicarbocyanine iodide | 6400 to 8000 | Green |
| 30 | 2-(p-dimethylaminostyryl) 3-4 dimethyl thiazolium-p-toluene sulfonate | 4800 | Yellow |
| 31 | 2(4-p-dimethylaminophenyl-1-3 butadienyl)benzothiazole metho-p-toluene sulfonate | 5400 | Purple |
| 32 | 2-[1-cyano-5(3-ethyl-2(3H) benzoxazolylidene)1-3 pentadienyl]benzothiazole | 5400 | Purple |
| 33 | 4[7-3-ethyl-2[3H]benzothiazolylidene)1-3-5 heptatrienyl] quinoline | 4800 | Yellow |
| 34 | 2[(3-ethyl-2(3H)benzothiazolylidene)ethylidene]aminobenzothiazole | 4600 | Yellow |
| 35 | p-dimethylaminobenzylidene 2,2' dibenzothiazolyl methane | 4400 | Yellow |
| 36 | 4-4'-vinylidene-bis-(N,N-dimethylaniline) iodide | 6200 | Cyan |

DYE CLASS E

9-Phenyl-fluoren-9-ols

Dye class E are the iodides, sulfates, and sulfonates of the 9-phenyl-fluoren-9-ols described in U.S. Pat. No. 3,000,833 and represented by the formula:

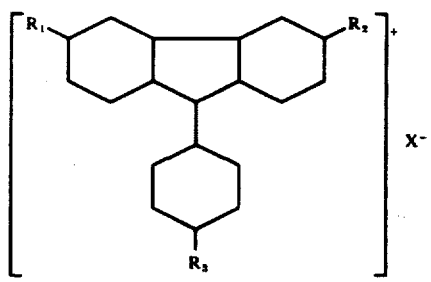

in which X is an anion selected from the class consisting of iodides, sulfates and sulfonates; $R_1$, $R_2$ and $R_3$ are selected from the group consisting of amino, H, methoxy, and dialkylamino, at least two being $NH_2$ or dialkylamino and in which one or more of the aromatic hydrogens may be replaced by alkyl, alkoxy, halogen, nitro, acetamido, acetyl, or sulfonamido radicals.

The dye salts are relatively stable in solution and the photopolymerizable solutions containing these materials do not require refrigeration on storage to maintain the stability prior to exposure.

| DYE NO. | DYE | LONG WAVELENGTH Å RESPONSE | COLOR OF DYE IN PHOTORESIST |
|---|---|---|---|
| 37 | para-toluene sulfonate salt of 3,6-bis(dimethylamino)-9-phenylfluoren-9-ols | 9000 to 11,000 | Greenish-Purple |
| 38 | iodide salt of 3,6 dimethylamino)-9-(2-methoxy-5-iodophenyl) fluoren-9-ols | 9000 to 11,000 | Greenish-Purple |

TABLE 2

THE POLYMERIZABLE MONOMERS
A. N-VINYLAMINES
  1. N-vinyl indole
  2. N-vinyl carbazole
  3. N-vinyl phenyl-napthylamine
  4. N-vinyl pyrolle
  5. N-vinyl diphenylamine (stabilized with 0.1% cyclohexylamine)
B. N-VINYLAMIDES AND IMIDES
  1. N-vinyl succinimide
  2. N-vinyl phthalimide
  3. N-vinyl pyrollidone
  4. N-vinyl-N-methylacetamide
  5. N-vinyl-N-phenylacetamide
  6. N-vinyl diglycolimide
  7. N-vinyl imidazole
C. ACRYLAMIDES AND CONGENERS
  1. Acrylamide
  2. Methylacrylamide
  3. N,N'diphenylacrylamide
  4. N,N'methylene bisacrylamide
  5. N-phenylacrylamide
  6. N,N'diphenyl methyl acrylamide
  7. Methyl acrylanilide

TABLE 3

Iodine Containing Activators

Suitable halogen-containing activators useful in this invention include the following iodine containing compounds:
1. Iodoform
2. Carbon tetraiodide
3. Tetaiodethylene
4. Tribromiodomethane
5. Alpha, alpha, di-iodotoluene
6. Alpha, alpha, alpha tri-iodotuluene
7. Aryl sulfonyliodides
8. Aryl sulfenyliodides
9. $\alpha, \alpha$ Diodo methyl furan

TABLE 4

The Stabilizers

Suitable stabilizers include phenolic compounds such as those described in U.S. Pat. No. 3,351,467 and may be represented by the general formula

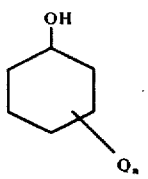

wherein Q may represent one or more hydroxyl groups, amino groups, alkyl and/or allyl groups, and $n$ is an integer not less than 1 and not greater than 5. When $n$ is greater than 1, all the Q's used need not be the same. Examples are:

1. 2,6 di-t-butyl cresol
2. p-aminophenyl
3. catechol
4. 2,4 di-t-pentylphenol
5. 2,5-bis(1,1-dimethylpropyl)hydroquinone
6. 2,6-di-t-butyl-p-phenol
7. 5-butyl hydroxyanisole

TABLE 5

The Resin Binders

The following is a list of some of the resin binders found suitable in this invention:

1. Polyvinyl butyral
2. polyvinylalcohol-vinylacetate
3. Polyvinyl acetate
4. Vinyl acetate — vinylchloride copolymer
4. Polyvinyl proprionate
6. Polyvinyl butyrate
7. Copolymer of polystyrene and polysulfone
8. Polyvinyl ketone
9. Copolymer of polyvinylbutyral-polyvinylalcohol-polyvinylacetate
10. Hydroxypropyl cellulose
11. Ethyl cellulose
12. Cellulose acetate butyrate

TABLE 6

Solvents (Alone and in Mixtures)

1. Chloroform
2. Cyclohexanone
3. Toluene + ethanol (3:2)
4. Benzene + methanol (1:1)
5. Butyl acetate
6. Acetonitrile
7. Aliphatic alochols
8. Methylene chloride
9. Cyclohexanol
10. Alcohol-water azeotropes
11. Methyl ethyl ketone
12. Methyl butyl ketone
13. Methyl cellosolve
14. N-methyl pyrrolidone
15. Dimethylformamide
16. Cyclic ethers

TABLE 7

| METALLO-ORGANIC ADDITIVES TO IMPROVE ELECTRON BEAM AND X-RAY RESPONSE | | |
|---|---|---|
| 1. | Tetraphenyl lead | $Ph_4Pb$ |
| 2. | Triphenylstibine | $Ph_3Sb$ |
| 3. | Tetraphenylstibine | $Ph_3Sb \cdot SbPh_3$ |
| 4. | Triphenylbismuthine | $Ph_3Bi$ |
| 5. | Triphenylleadbromide | $Ph_3PbBr$ |
| 6. | Phenyl mercuric iodide | $PhHgI$ |
| 7. | Hexaphenyldilead | $Ph_3Pb \cdot PbPh_3$ |

Other metallorganic compounds which may be used to diminish fogging are the triaryl compounds of As, Bi, Sb, Sn, P and Pb are those described in U.S. Pat. No. 3,275,443 issued on Sept. 27, 1966, the disclosure of which is incorporated herein by reference. The triaryl compounds of Group V elements As, Sb, Bi and P and/or the metalloorganic compounds of the heavy metals Pb, Hg may each be used alone or may be used together depending on whether the property to be imparted to the composition is fog elimination or enhanced sensitivity to electron beams and x-radiation, or both.

TABLE 8

| COMPOSITION RANGES | | |
|---|---|---|
| CONSTITUENTS | RANGE IN PARTS BY WEIGHT | PREFERRED |
| 1. Polymerizable Monomer | 100 to 300 | 150 |
| 2. Stabilizer | 0 to 100 | 50 |
| 3. Activator | 15 to 300 | 100 |
| 4. Metallo-Organic Compound | 0 to 100 | 50 |
| 5. Image Color Compound | 0.005 to 5 | 1 |
| 6. Binder | 200 to 3000 | 500 |
| 7. Solvent | 3000 to 10,000 | 8000 |

(Note: Item 4 is used generally only for x-ray and electron beam sensitivity, except that the Group V triaryl compounds may also be used for fog prevention purposes during the first heating step immediately after exposure. In the above range of compositions, it is a requirement that in the composition after solvent removal, the weight of the binder always be substantially greater than the sum of the weight of the remaining ingredients.)

EXAMPLES 1–10

| (Prior Art) (No Dyes or Sensitizers Added) THE BASE COMPOSITION | |
|---|---|
| N-vinyl monomer | 150 g N-vinylcarbazole |
| Stabilizer | 50 g 2,6-di-tert-butyl cresol |
| Activator | 100 g iodoform |
| Binder | 400 g polyvinylbutyral (M.W. 100,000) |
| Solvent | (2000 cc methyl alcohol) (3000 cc propyl alcohol) (3000 cc butyl alcohol) |

The ingredients of the above formulation were dissolved in the solvent mixture in the order given, making certain each constituent was completely in solution before the next constituent was added.

A 1.5 mil wet thickness of the resulting formulation was applied to sheets of subbed polyethylene terephthalate. The wet composition was dried at 35° C for 60 seconds in an air flow oven. Exposure was then carried out in the U.V. through step wedges and narrow band pass calibrated filters to the wavelengths indicated in the table below. After exposure, the sample was heated for 60 seconds at 120° C and the spray developed in methyl alcohol for 10 seconds, followed by drying in an air flow oven at 100° C for 60 seconds.

In Examples 1–5 the speed point was determined for the wavelengths listed by establishing the least exposure required for retaining the exposed composition on the transparent base while still obtaining complete removal of the unexposed areas in the development step.

| Example No. | Wavelength Å | Speed Point mj/cm$^2$ |
|---|---|---|
| 1 | 3500 | 1.00 |
| 2 | 4000 | 1.25 |
| 3 | 4200 | 2.50 |
| 4 | 4400 | 10.0 |
| 5 | 4600 | zero |

Then, on a gram for gram basis, the compound listed under the heading "Monomer" was substituted for the N-vinylicarbazole in the base composition given above, exposed in the atmosphere given, and the speed point at 4000 A established. These results are shown in Examples 6 through 10, again being indicative of pertinent prior art.

| Example No. | Monomer | Atmosphere | Speed Point mj/cm$^2$ |
|---|---|---|---|
| 6 | N-vinylphthalimide | $CO_2$ | 5.0 |
| 7 | N-vinylimidazole | $CO_2$ | 2.0 |
| 8 | N-vinylindole | air | 2.0 |
| 9 | N-vinylpyrrolidone | $CO_2$ | 5.0 |
| 10 | N-vinylsuccinimide | $CO_2$ | 1.0 |

The base composition used for examples 1 through 5 was prepared, exposed, thermally treated as before and then wet developed as defined in Examples 11 through 22 in the table.

TABLE (EXAMPLES 11–22)

Acid Developers

To produce a colored image result one or more dyes taken from Table 1, in amounts varying from 5 to 5000 mg. dissolved in 100 to 1000 cc of a suitable solvent, are added to the compositions of Examples 1 through 10.

| Ex. No. | Name of Acid | Concentration Range in Water (%)* | Time of Treatment Seconds | Concentration Range in 50% Alcohol + 50% Water Acid Solution (%)** |
|---|---|---|---|---|
| 11 | Hydrochloric | 20–37 | 15–60 | 15–18 |
| 12 | Sulfuric | 20–90 | 6–60 | 20–40 |
| 13 | Hydrofluoric | 15–50 | 5–60 | 15–25 |
| 14 | Nitric | 15–50 | 5–60 | 15–25 |
| 15 | Phosphoric | 25–75 | 60–120 | 15–30 |
| 16 | Formic | 25–100 | 5–60 | 25–50 |
| 17 | Acetic | 25–100 | 15–60 | 20–50 |
| 18 | 2 Formic + 1 Adipic | 20–50 | 40–150 | 20–30 |
| 19 | 2 Formic + 1 Citric | 20–50 | 180–360 | 20–30 |
| 20 | 2 Formic + 1 Oxalic | 20–50 | 180–360 | 20–30 |
| 21 | 2 Formic + 1 Itaconic | 20–50 | 180–360 | 20–30 |
| 22 | 2 Formic + 1 Tannic | 20–50 | 180–360 | 20–30 |

*The stronger the acid and the longer the time, the greater the degree of removal of unexposed photoresist material in addition to leach-out of dye.
**These concentrations suitable only for complete removal of dye and polymeric composition (unexposed). Time of treatment for full development between 10 and 40 seconds (spray).

EXAMPLES 23–30

The procedure of Examples 1–5 was followed except that monomers listed below were substituted on a gram for gram basis for the N-vinyl carbazole used in Example 1 and except that the solvent used was a mixture of 400 cc's of benzene and 4000 cc's of methyl alcohol and that 0.5 grams of Dye No. 6 (Table 1) was dissolved in 100 cc's of methylene chloride and was added to the formulation in the dark and stirred in; and the composition after spreading on a sheet of subbed polyethylene terephthalate was dried in the dark. After drying, the surface was exposed for varying lengths of time to a calibrated monochromator with the majority of its light emission at 6400 A at which wavelength the monochromator was calibrated. After exposure and thermal treatment as defined as defined in Example 1, the samples were spray developed to completion at room temperature, 15 to 20 seconds being required in each example using a solution containing 40 percent formic acid, 30 percent methyl alcohol and 30 percent water (by weight). The samples were washed by dipping once in methyl alcohol, drained, dried at 100° C for 60 seconds. The photopolymer remaining as the result of the above was colored blue in each case.

| EXAMPLE NO. | MONOMER | ATMOSPHERE | SPEED POINT MJ/CM$^2$ |
|---|---|---|---|
| 23 | N-vinyl-phthalimide | $CO_2$ | 5 |
| 24 | N-vinyl-imidazole | $CO_2$ | 2 |
| 25 | N-vinyl-indole | Air | 2 |
| 26 | N-vinyl-pyrrolidone | $CO_2$ | 5 |
| 27 | N-vinyl-succinimide | $CO_2$ | 1 |
| 28 | N-vinyl-carbazole | Air | 1 |
| 29 | Methyl-acrylamide | $CO_2$ | 35 |
| 30 | 60 Methyl-acrylamide plus 40 N,N'-methylene bisacrylamide | $CO_2$ | 10 |

EXAMPLES 31–36

Composition and other treatments were the same as in Example 28, except that the developers listed in Examples 31 through 36 were used. In each of the examples of the specific developer was used for the listed time, which time was always sufficient to remove all dye from unexposed areas by leaching, though not necessarily sufficient to remove all of the remainder of the now colorless previously unexposed polymerically bound material. When an alcohol was included in the developer all unexposed material was removed in the time period listed. In each case exposure was imagewise to a bank of three 15 watt daylight fluorescent lamps at a distance of 10 inches for a 10 second period.

| EXAMPLE NO. | DEVELOPER COMPOSITION | TIME(SEC.) |
|---|---|---|
| 31 | 37% hydrochloric acid in water | 25 |
| 32 | 37% HCl in water (50%) Methyl alcohol (50%) | 20 |
| 33 | 75% formic acid in water | 35 |

-continued

| EXAMPLE NO. | DEVELOPER COMPOSITION | TIME(SEC.) |
|---|---|---|
| 34 | 50% formic acid plus 50% ethyl alcohol | 20 |
| 35 | 40 grams formic acid 20 grams adipic acid 150 grams water | 100 |
| 36 | 50 grams of Example 35 mixture 50 grams of methyl alcohol | 50 |

EXAMPLE 37

Example 1 was repeated except that 100 mg of each dye listed in Table 1 was added in separate evaluations. In each case, the dye was dissolved in 500 cc's of a solution comprised of 250 cc's of methylene dichloride and 250 cc's of dimethylsulfoxide, the dye additions being made in darkness. Two sets of exposure samples were prepared on subbed Mylar. The first set was processed as defined for Example 1 from 3200 A up through the wavelengths given in Table 1 which defined that all the compositions were sensitive from 3200 A through the wavelengths recited in the table. Thereafter, the sensitivity dropped sharply at wavelengths longer than those recited in the table. The long wavelength sensitivity imparted by each dye and the exposure required are given in Table 1.

By measuring the density of the color obtained in each case with light of complementary wavelength, it was established that a density of 2.0 or more was achieved in each case.

Thereafter, each sample was blanket exposed to the radiation from a 275 watt GRS sunlamp (G.E.) at a distance of 10 inches for 30 minutes. All of the samples bleached out to a residual complementary color density of 0.15 or less.

The second set of samples were exposed as before but were processed in accordance with the teachings of this invention by wet development in a 75 percent solution of formic acid in water for 45 seconds. Complementary color densities measured in each case were in excess of 3.0.

Each sample was blanket exposed to the radiation from a 275 watt GRS sunlamp (G.E.) at a distance of 10 inches for 30 minutes. The complementary color density in each case remained at 3+.

EXAMPLE 38

| ITEM | | COMPOSITION |
|---|---|---|
| 1. | 150g | N-vinyl carbazole |
| 2. | 50g | 2,6-di-tert-butyl cresol |
| 3. | 100g | iodoform |
| 4. | 50g | triphenylbismuthine |
| 5. | 0.2g | Dye No. 25 (Table 1) |
| 6. | 500g | Bakelite 251 Vinylketone polymer |
| 7. | Solvent for dye | 250 cc's of methylene dichloride 250 cc's of dimethylsulfoxide |
| 8. | Solvent for radiation sensitive composition | 3000 cc's toluene 3000 cc's methylethylketone 2000 cc's methyl alcohol |

Items 1, 2, 3, 4 and 6 were dissolved in the order given in Solvent No. 8 under a red safelight. Item No. 5 was dissolved in Solvent No. 7 and then added in the dark to the main solution and then stirred in.

A 3 mil wet thickness was spread on a glass plate and then allowed to dry in the dark at room temperature for 3 hours.

The glass plate was inserted in a demountable cathode ray tube emulsion side up, which emulsion surface represented the focus of the electron beams emerging from the cathode ray gun.

The beam current utilized was 20 microamperes, the accelerating potential was 5 kilowatts, the beam energy was 317.5 watts per cm square; the time on one spot diameter was 2.7 microseconds; the minimum spot exposure was equivalent to 4.33 times $10^{-3}$ joules per cm square; the peak to peak amplitude of the electron beam trace was 1.2 cm and the beam diameter was 0.2 mm.

As a result of exposures of varying velocities of transverse movement of the electron beam by the transverse reflectance control, a writing speed of 1.2 times $10^6$ cm per second was detected as the limiting writing speed.

Wet development of the exposed result was carried out with 100 percent formic acid for 20 seconds. After washing and drying, the color density of the red image trace written at a speed of $1.0 \times 10^5$ cm per second was 3+ when measured with the blue filter in the densitometer.

EXAMPLE 39

Same composition as in Example 38. The photosensitive layer coated glass plate was placed in a light tight black polyethylene envelope in which the black color was produced by pigmentation with carbon black and the photosensitive layer was up. A pattern made of ⅛ inch lead sheet was placed on top the polyethylene envelope. The assembly, pattern side up, was placed 12 inches from the target of an X-ray tube. Exposure was made for 5 seconds at 30 kilowatts and 5 milliamperes.

After processing and wet development for 15 seconds in 100 percent formic acid in accordance with the teachings of this invention, a dense red image was obtained whose color density measured on a densitometer with a blue filter was 3+.

We claim:

1. A colored photosensitive composition suitable for use in the production of colored images, consisting essentially of:
   1. at least one N-vinyl monomer
   2. an iodine containing activator selected from the group consisting of alkyl iodides, sulfenyl iodides and sulfonyl iodides;
   3. a phenolic compound represented by the formula

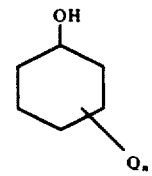

where n is an integer up to 5 and Q represents monovalent radicals selected from the group consisting of hydroxyl, amino, alkyl and allyl;
   4. at least one acid leachable dye selected from the group consisting of
      a. substituted anthraquinones
      b. binuclear merocyanines
      c. complex merocyanines
      d. cyanines
      e. 9-phenyl-fluoren-9-ols; and
   5. and alcohol soluble, acid insoluble resin binder;

each of the above constitutents being dispersed or disolved in said resin binder, the amount of leachable dye being sufficient to impart a distinct color to the photosensitive composition and the above constitutents being present in the following relative proportions, by weight:
N-vinyl monomer: 100 to 300
iodine containing activator: 15 to 300
phenolic compound: up to 100
acid leachable dye: 0.005 to 5.

2. The photosensitive composition of claim 1 wherein the alcohol soluble, acid insoluble resin binder is selected from the group consisting of polyvinyl butyral, polyvinylalcoholvinylacetate, polyvinyl acetate, vinyl acetate - vinylchloride copolymer, polyvinyl proprionate, polyvinyl butyrate, copolymer of polystyrene and polysulfone, polyvinyl ketone, copolymer of polyvinylbutyral-polyvinylalcohol-polyvinylacetate, hydroxypropyl cellulose, ethyl cellulose and cellulose acetate butyrate.

3. The composition of claim 1 wherein the proportions by weight are approximately:
N-vinyl monomer: 150
activator: 100
phenolic compound: 50
leachable dye: 1.

4. The photosensitive composition of claim 1 containing in addition at least one metalloorganic compound.

5. The composition of claim 4 wherein the metalloorganic compound is one which sensitizes the composition to X-rays and electron beams.

6. The composition of claim 4 wherein the metalloorganic compound is a triaryl compound of P, Sb, Bi or As and is present in an amount which diminishes thermal fogging of the composition.

7. The photosensitive composition of claim 1 wherein the photopolymerizable N-vinyl manomer is N-vinyl carbazole and the activator is iodoform.

* * * * *